United States Patent [19]

Arimoto et al.

[11] Patent Number: 5,272,712
[45] Date of Patent: Dec. 21, 1993

[54] SEMICONDUCTOR LASER DEVICE

[75] Inventors: Satoshi Arimoto; Takashi Nishimura; Takashi Motoda, all of Itami, Japan

[73] Assignee: Mitsubishi Denki Kabushiki Kaisha, Tokyo, Japan

[21] Appl. No.: 922,399

[22] Filed: Jul. 31, 1992

[30] Foreign Application Priority Data

Feb. 28, 1992 [JP] Japan .................................. 4-79056

[51] Int. Cl.$^5$ ................................................. H01S 3/19
[52] U.S. Cl. ......................................... 372/45; 257/14; 257/15; 257/18
[58] Field of Search ..................... 372/45, 43; 257/14, 257/15, 18

[56] References Cited

U.S. PATENT DOCUMENTS

| | | | |
|---|---|---|---|
| 4,984,242 | 1/1991 | Seifres et al. | 372/45 |
| 4,999,844 | 3/1991 | Imamoto | 372/45 |
| 5,010,376 | 4/1991 | Nishimura et al. | 372/45 |
| 5,091,756 | 2/1992 | Iga et al. | 372/45 |

FOREIGN PATENT DOCUMENTS

| | | |
|---|---|---|
| 0457571 | 11/1991 | European Pat. Off. . |
| 62-173790 | 7/1987 | Japan . |
| 63-46788 | 2/1988 | Japan . |
| 1-7587 | 1/1989 | Japan . |
| 1-64284 | 3/1989 | Japan . |
| 2241884 | 9/1989 | Japan . |

OTHER PUBLICATIONS

Sugimoto et al., "Indium Composition Dependent Threshold Current Density in Strained InGaAs/AlGaAs Quantum Well Lasers", Japanese Journal of Applied Physics, vol. 30, No. 12B, 1992, pp. L2098–L2100.
Takagi et al., "Design and Photoluminescence Study on a Multiquantum Barrier", IEEE Journal of Quantum Electronics, vol. 27, No. 6, Jun. 1991, pp. 1511–1519.
Iga et al., "Electron Reflectance of Multiquantum Barrier (MQB)", Electronics Letters, vol. 22, No. 19, Sep. 1986, pp. 1008–1010.
Kishino et al., "The Lowest $J_{th}$ (840A/cm$^2$) and High $T_o$(167K) Achievements of 660 nm GaInP/AlInP Visible Light Lasers by a Novel Multi-Quantum Barrier (MQB) Effect", 12th IEEE International Semiconductor Laser Conference, Sep. 1990, pp. 21–22.
Rennie et al., "High Temperature (90° C.) CW Operation of 646nm InGaAlP Laser Containing Multiquantum Barrier", Electronics Letters, vol. 28, No. 2, Jan. 1992, pp. 150–151.

Primary Examiner—Georgia Y. Epps
Attorney, Agent, or Firm—Leydig, Voit & Mayer

[57] ABSTRACT

A semiconductor laser device includes a first conductivity type cladding layer, an active layer, and a second conductivity type cladding layer disposed on a first conductivity type substrate. A multiquantum barrier structure is disposed between the active layer and one of the cladding layers. The active layer includes a layer with a lattice constant different from the lattice constant of the first conductivity type substrate by at least 0.1 percent so that a strain is applied to the active layer. The threshold current is significantly reduced, resulting in a high power semiconductor laser capable of operating at a high temperature.

10 Claims, 7 Drawing Sheets

SEMICONDUCTOR LASER DEVICE

FIELD OF THE INVENTION

The present invention relates to semiconductor laser devices comprising III-V and II-VI compound semiconductor materials that operate at a high temperature with a low threshold current.

BACKGROUND OF THE INVENTION

Generally, a semiconductor laser employs a double heterojunction structure in which an active layer is sandwiched by cladding layers having larger energy band gaps than the active layer. When a forward bias voltage is applied to the double heterojunction structure, carriers are injected into the active layer from the cladding layers and effectively confined in the active layer due to a potential barrier caused by the difference in the energy band gaps of the active layers and the cladding layers resulting in carrier recombinations that produce laser light. However, if the potential barrier is small, carriers in the active layer, especially electrons having a small effective mass, overflow into the cladding layers, whereby threshold current unfavorably increases, resulting in deterioration in laser characteristics. In order to suppress that overflow of carriers, a multiquantum barrier (hereinafter referred to as MQB) is proposed by K. Iga, H. Uenohara, and F. Koyama in Electronics Letters, Vol. 22 (1986). p. 1008.

Figure 9:
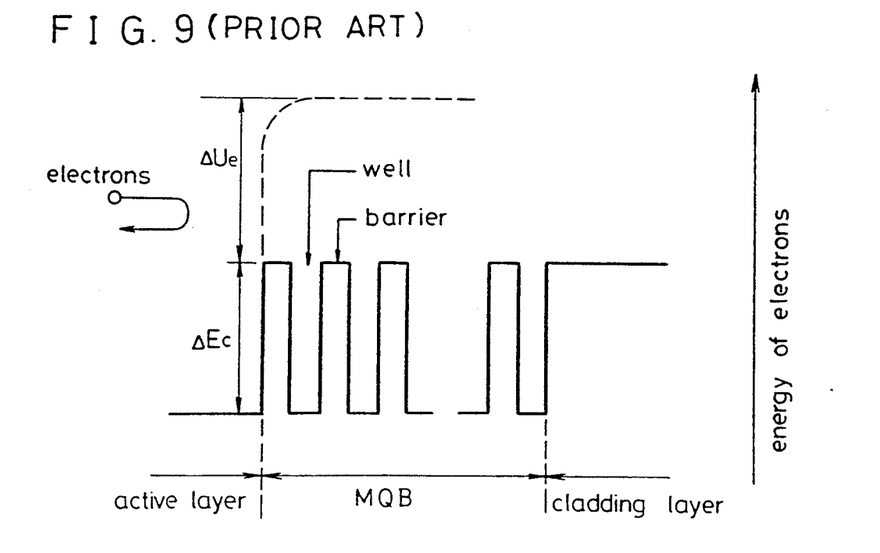
FIG. 9 is a schematic diagram of the MQB in accordance prior art.

The MQB has a multiquantum well structure comprising wells and barriers tens of Angstroms thick and utilizes a phenomenon in which an electron wave is reflected at the interface between the quantum wells and quantum barriers. When the MQB is inserted between an active layer and a cladding layer, electrons having energies higher than a potential barrier formed between the active layer and the cladding layer are reflected by the quantum mechanical effect of the MQB, whereby the overflow of electrons into the cladding layer is suppressed. This result is schematically shown in FIG. 9. In FIG. 9, reference character $\Delta Ec$ designates the difference in energy band gaps between the active layer and the cladding layer at the conduction band edge and reference character $\Delta Ue$ designates an increase in the effective potential barrier due to the MQB. In this way, electrons are reflected by the potential barrier caused by the MQB even when the electrons have energies higher than $\Delta Ec$ and are effectively confined in the active layer.

Figure 8:
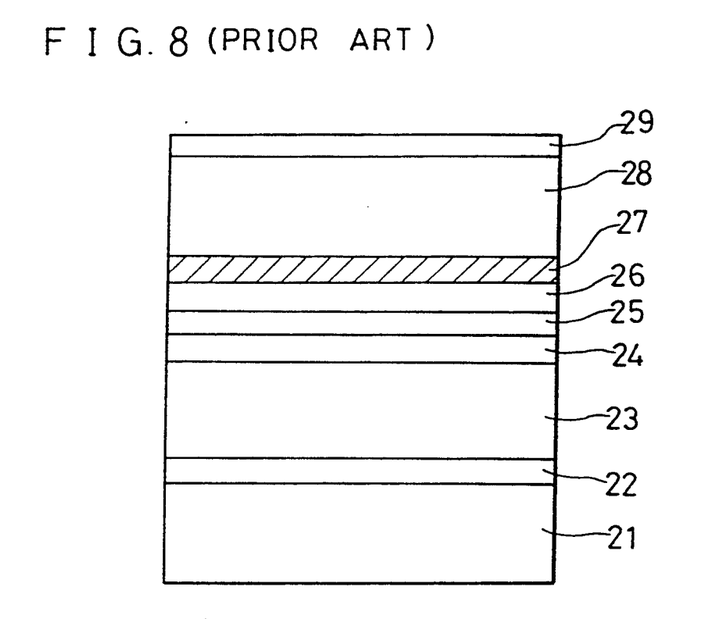
FIG. 8 is a cross-sectional view showing a semiconductor laser device incorporating an MQB in accordance with the prior art.

FIG. 8 is a cross-sectional view showing a semiconductor laser incorporating an MQB, disclosed in the conference digest of 12th IEEE International Semiconductor Laser Conference, 1990, p. 21, PD-10, by K. Kishino, A. Kikuchi, Y. Kaneko, and I. Nomura. In FIG. 8, there are successively epitaxially grown on an n type GaAs substrate 21 an n type GaInP buffer layer 22, an n type AlInP cladding layer 23, a superlattice cladding layer 24, a GaInP active layer 25, a superlattice cladding layer 26, an MQB 27 comprising GaInP wells and AlInP barriers, a p type AlInP cladding layer 28, and a p type GaInP cap layer 29. Preferably, these layers are grown in a gas source MBE process. The superlattice cladding layers 24 and 26 decrease non-radiative recombinations of carriers at the interfaces between the active layer 25 and the cladding layers 24 and 26 to improve the laser characteristics. In this prior art, the MQB was applied to a semiconductor laser for the first time and a reduction in the threshold current and an improvement in the temperature characteristic were achieved by the carrier overflow suppressing effect of the MQB.

In addition, Electronics Letters, 16th Jan. 1992, Vol. 28, No. 2, p.150 discloses a semiconductor laser including an InGaP/InGaAlP multiquantum well active layer and an InGaP/InGaAlP MQB inserted between an InGaAlP guide layer on the active layer and a p type InGaP cladding layer. In this laser structure, a high temperature (90° C.) CW (continuous wave) operation was realized.

In the conventional semiconductor laser devices incorporating the MQBs, the effects of the MQBs are logically and experimentally confirmed. However, the threshold current density of each laser is not sufficiently reduced solely by incorporating the MQB. In addition, the conventional MQBs are not optimized for suppressing an overflow of holes.

SUMMARY OF THE INVENTION

It is an object of the present invention to provide a semiconductor laser device that reduces a threshold current density and suppresses not only overflow of electrons but also overflow of holes.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, a semiconductor laser device includes a first conductivity type cladding layer, an active layer, and a second conductivity type cladding layer, on a first conductivity type substrate. A multiquantum barrier is disposed between the active layer and either of the cladding layers. The active layer includes a layer to which a strain is applied. Therefore, threshold current is significantly reduced by a synergistic effect of the multiquantum barrier and th strained active layer According to a second aspect of the present invention, a semiconductor laser device includes a multiquantum barrier in which semiconductor layers having large energy band gaps and semiconductor layers having small energy band gaps are alternated with each other, and strain is applied to at least one of the semiconductor layers. Therefore, the height of the potential barrier for confining holes is increased.

According to a third aspect of the present invention, a semiconductor laser device includes an active layer to which a strain is applied and a multiquantum barrier disposed between an n type cladding layer and the active layer. The multiquantum barrier is formed by alternating semiconductor layers having large energy band gaps and semiconductor layers having small energy band gaps and strain is applied to at least one of the semiconductor layers. Therefore, the threshold current is significantly reduced and the height of the potential barrier for confining holes is increased.

DETAILED DESCRIPTION OF THE PREFERRED EMBODIMENTS

Although the present invention is applicable to all III-V and II-VI compound semiconductor laser devices, a description will be given of an AlGaInP semiconductor laser device producing visible light.

Figure 1A:
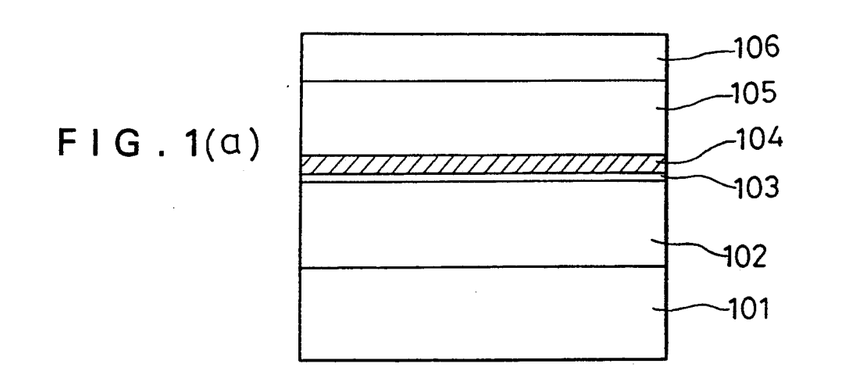
FIGS. 1(a)-(c) illustrate a semiconductor laser device in accordance with a first embodiment of the present invention.
Figure 1B:
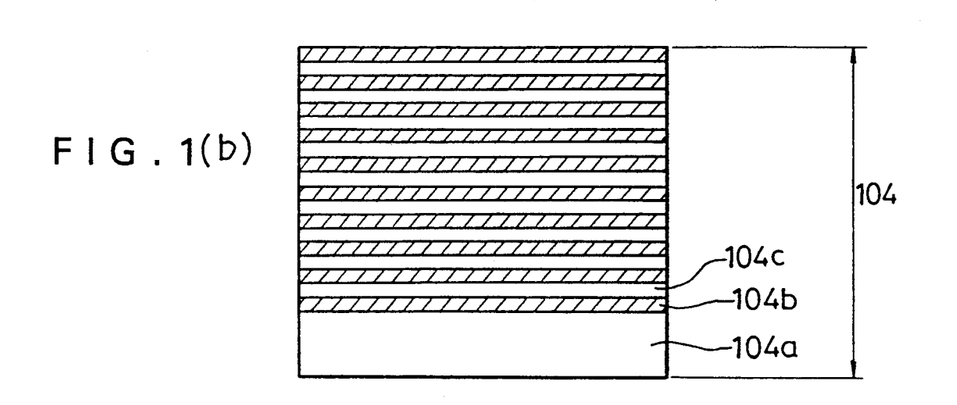

FIG. 1(a) is a cross-sectional view showing an AlGaInP laser device producing visible light in accordance with a first embodiment of the present invention. In FIG. 1(a), reference numeral 101 designates an n type GaAs substrate. An n type $(Al_{0.7}Ga_{0.3})_{0.5}In_{0.5}P$ cladding layer 102 1.5 microns thick is disposed on the substrate 101 and a $Ga_xIn_{1-x}P$ active layer 103 is disposed on the cladding layer 102. An MQB 104 is disposed on the active layer 103. As shown in FIG. 1(b), the MQB 104 has a superlattice multilayer structure comprising twenty layers, i.e., a p type $(Al_{0.7}Ga_{0.3})_{0.5}In_{0.5}P$ buffer layer 104a 226 angstroms thick, ten p type $Ga_{0.5}In_{0.5}P$ well layers 104b each 11.5 angstroms thick, and nine p type $(Al_{0.7}Ga_{0.3})_{0.5}In_{0.5}P$ barrier layers 104c each 17 angstroms thick. A p type $(Al_{0.7}Ga_{0.3})_{0.5}In_{0.5}P$ cladding layer 105 1.5 microns thick is disposed on the MQB 104 and a p type GaAs layer 106 0.5 micron thick is disposed on the cladding layer 105. Regarding the crystal composition, $(Al_yGa_{1-y})_xIn_{1-x}$ lattice-matches with GaAs when x=0.5 and 0<y<1. In this embodiment, x is not equal to 0.5 in the $Ga_xIn_{1-x}P$ active layer 103, so that it may not lattice-match with GaAs. More specifically, when x>0.5, since the lattice constant of the $Ga_xIn_{1-x}P$ is smaller than the lattice constant of GaAs, a tensile strain is applied to the active layer 103 in the layer structure shown in FIG. 1(a). When x<0.5, since the lattice constant of the $Ga_xIn_{1-x}P$ is larger than the lattice constant of GaAs, a compressive strain is applied to the active layer 103.

Figure 1C:
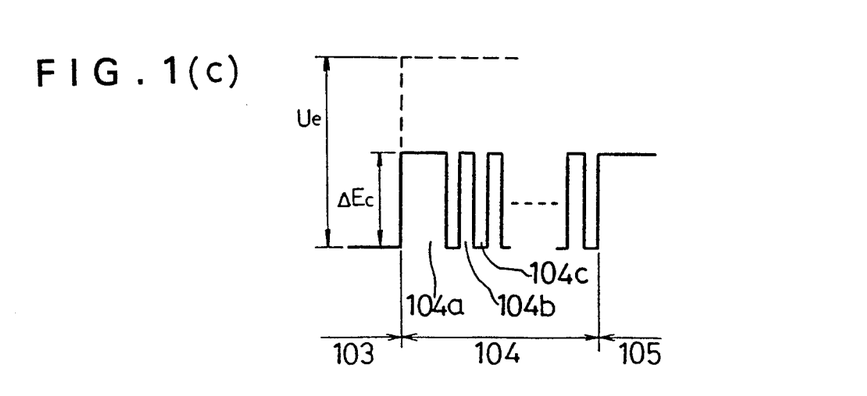

In FIG. 1(c), a height of an effective barrier Ue for confining electrons increases because of the MQB 104. More concretely, the height of the effective barrier Ue is twice as high as a difference in energy band gaps ΔEc (~150 meV) between the active layer 103 and the p type $(Al_{0.7}Ga_{0.3})_{0.5}In_{0.5}P$ buffer layer 104a at the conduction band edge.

A description is given of laser characteristics of the semiconductor laser device on the basis of experiments. When the laser characteristics were examined using a $Ga_xIn_{1-x}P$ active layer 150 angstroms thick while varying x in a range of 0.5 to 0.45, a strain of 0 to 0.45% was found.

Figure 2:
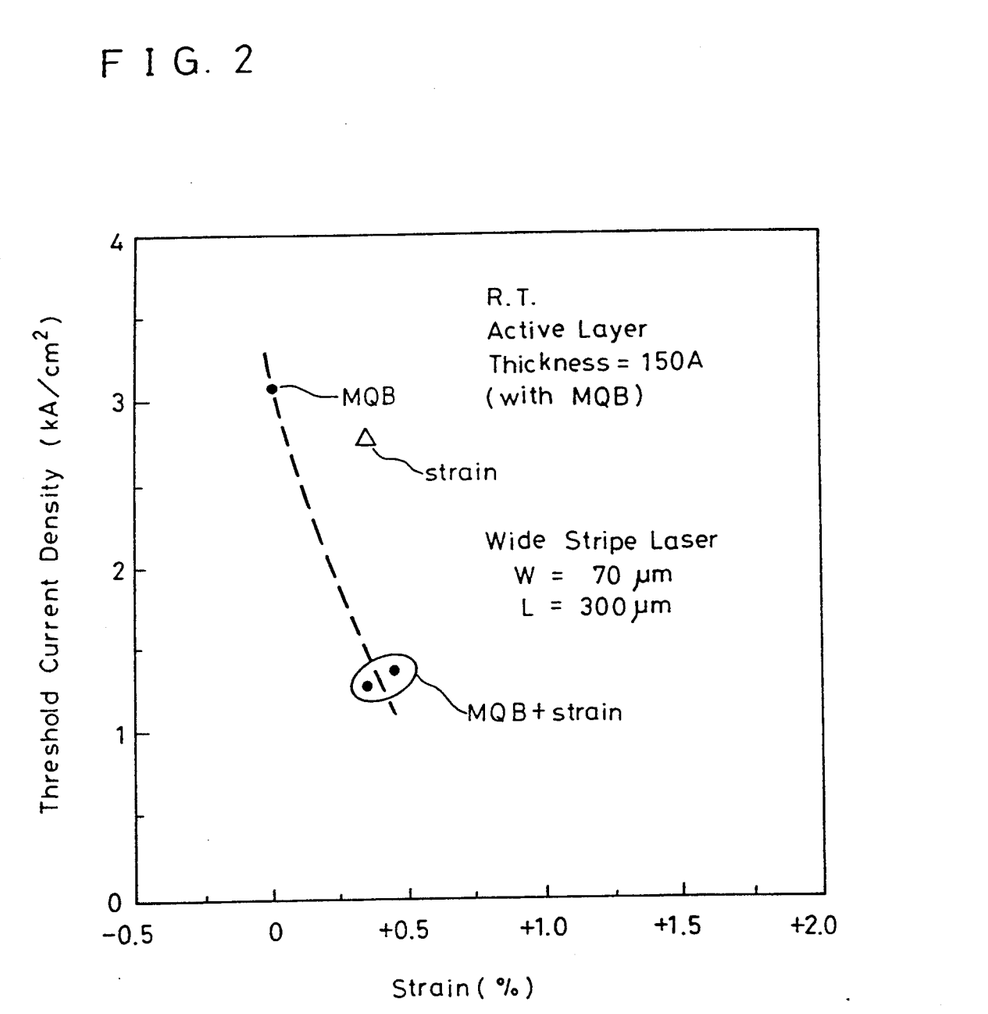
FIG. 2 is a graph showing relationship between threshold current density and strain applied to an active layer.

FIG. 2 is a graph showing the relation between the strain applied to the active layer 103 and the threshold current density of the laser. As shown in FIG. 2, when the MQB is provided or the strain is applied to the active layer, the threshold current density is about 3 $KA/cm^2$, which means that the threshold current density is not sufficiently reduced. However, when the provision of the MQB and the application of strain to the active layer are combined, the threshold current density is significantly reduced to about 1.2 $KA/cm^2$.

In this first embodiment of the present invention, active layer 103 is only 150 angstroms thick to increase the output power of the laser. Generally, when the active layer is thin, light is not sufficiently confined in the active layer and a greater part of the light overflows into the cladding layer. Therefore, the light density at a laser output facet of the laser device decreases and destruction of the facet caused by a high power operation is avoided, so that a high output laser device is realized. However, when the active layer is thin, its volume is small and the carriers in the active layer, for example, electrons, easily climb over the light confining barrier ΔEc shown in FIG. 1(c) and flow into the cladding layer. This overflow of electrons causes a significant increase in the threshold current. In order to avoid this flow, it is effective to increase the height of the barrier for confining electrons with the MQB. However, as is evident from the result of the experiment as shown in FIG. 2, the threshold current density is not sufficiently reduced only by providing the MQB.

On the other hand, it is well known that the threshold current density is reduced by applying a strain to the active layer. For example, when a compressive strain is applied to the active layer, the effective mass of holes decreases, i.e., the effective density of state of the valence band decreases, so that a threshold carrier concentration, at which laser oscillation begins, is lowered, resulting in a reduction in the threshold current density. However, as shown in FIG. 2, even when a strain is applied to the active layer, the threshold current density is as high as 2.8 $KA/cm^2$, which means that the threshold current density is not sufficiently reduced.

Although not shown in FIG. 2, in a laser structure having an active layer 150 angstroms thick, if no MQB is provided and no strain is applied to the active layer, no lasing oscillation occurs. Therefore, by only providing the MQB or only applying the strain to the active layer, the threshold current density is reduced to a certain extent.

In the first embodiment of the present invention, since the laser structure includes both the MQB and the strained active layer having a crystal composition in which the lattice constant is different by 0.1 percent or more from the lattice constant of the substrate, the threshold current density is significantly reduced as shown in FIG. 2.

Figures 3A, 3B:
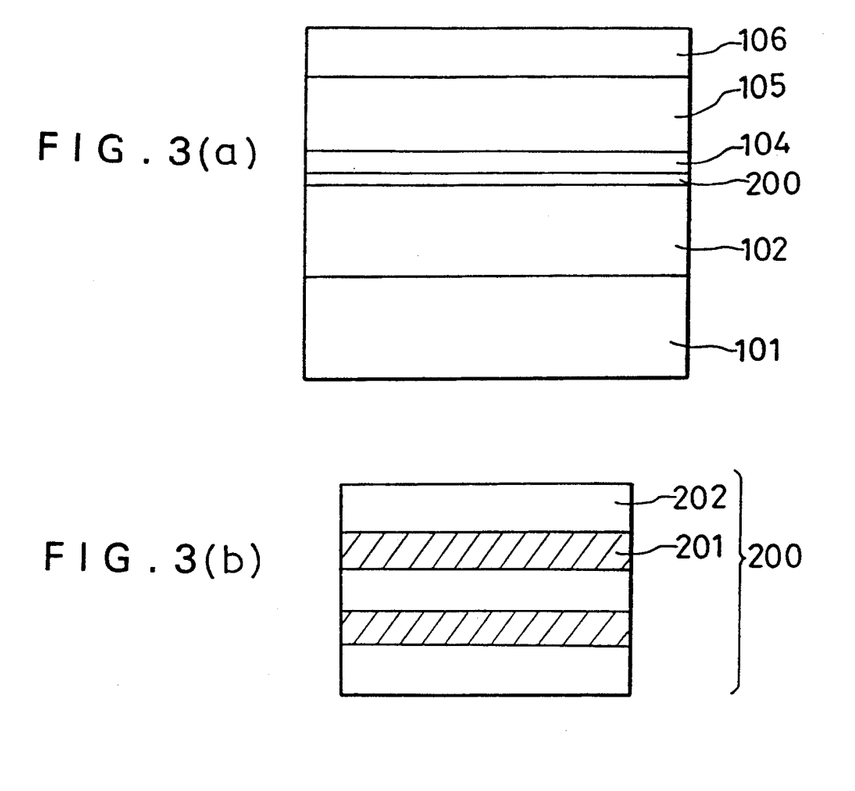
FIGS. 3(a)-(b) are cross-sectional views showing a semiconductor laser device in accordance with a second embodiment of the present invention.

FIG. 3(a) is a cross-sectional view showing a semiconductor laser device incorporating an MQB in accordance with a second embodiment of the present invention. In FIG. 3(a), a strained active layer 200 is disposed on an n type cladding layer 102. The active layer 200 comprises $(Al_{0.7}Ga_{0.3})_{0.5}In_{0.5}P$ barrier layers 201 each 80 angstroms thick and $Ga_AIn_{1-A}P$ well layers (A=0.5) 202 each 100 angstroms thick. The same reference numerals as those shown in FIG. 1 designate the same parts.

While in the first embodiment the active layer 103 is a single crystal layer, in this second embodiment the active layer 200 has a multiquantum well structure comprising the barrier layers 201 and the well layers 202 as shown in FIG. 3(b). In this embodiment, strains are applied to the well layers 202, whereby the whole active layer 200 has a strain and the same effect as described in the first embodiment is obtained.

While in the above-described second embodiment strains are applied to all well layers 202, strain may be applied to only one well layer. Also in this case, the same effect as described above is obtained.

In the above-described first and second embodiments, since the laser includes the MQB and the strained active layer, the threshold current density, at which the lasing oscillation begins, is significantly reduced. However, when a compressive strain is applied to the active layer, the effective mass of holes in the active layer is reduced, whereby the holes are likely to overflow into the cladding layer. Accordingly, if the overflow of holes can be reduced, the threshold current density is further reduced.

Figure 4:
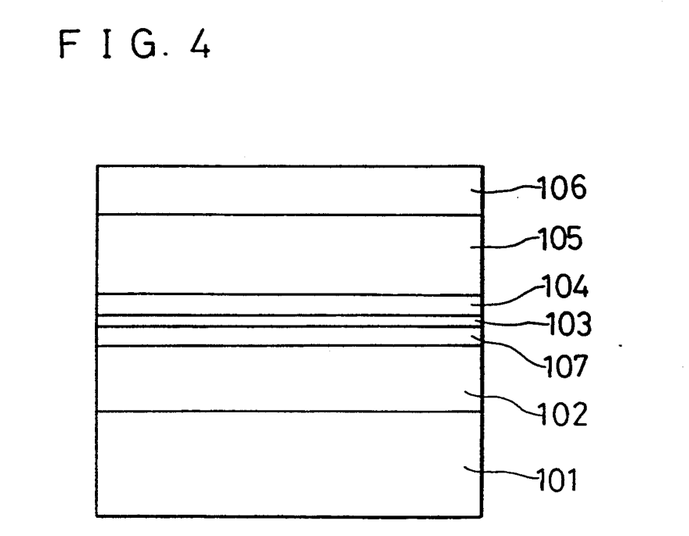
FIG. 4 is a cross-sectional view showing a semiconductor laser device in accordance with a third embodiment of the present invention.

FIG. 4 is a cross-sectional view showing a semiconductor laser device incorporating an MQB in accordance with a third embodiment of the present invention. In FIG. 4, an MQB 107 is inserted between an active layer 103 and an n type cladding layer 102. The same reference numerals as in FIG. 3(a) designate the same parts.

While in the first embodiment the MQB 104 is inserted between the p type cladding layer and the active layer, in this third embodiment, in addition to the MQB 104, an n type MQB 107 is inserted between the n type cladding layer 102 and the active layer 103. The n type MQB 107 increases the potential barrier for confining holes in the active layer 103, whereby the threshold current density is further reduced.

Since the MQB 107 employed in the third embodiment has the same structure as the conventional one, the increase in the barrier for confining holes in the active layer 103 is not sufficient. A description is now given of an MQB producing a higher barrier for confining carriers, especially holes, than the conventional MQB.

Figure 5A:
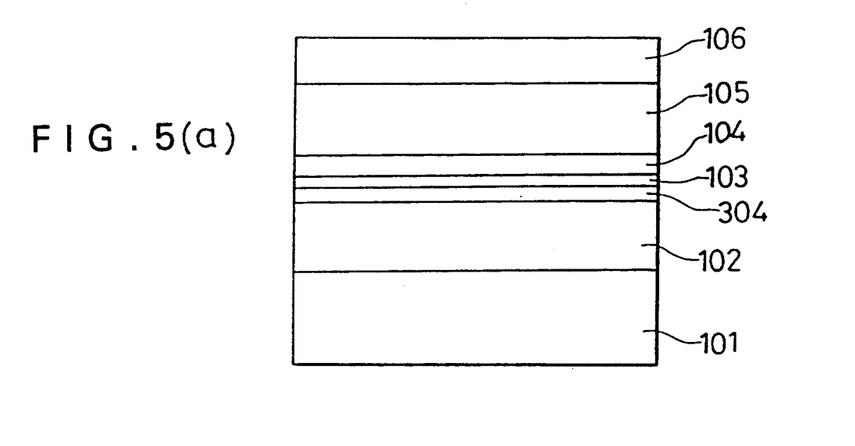
FIGS. 5(a)-(b) are cross-sectional views showing a semiconductor laser device in accordance with a fourth embodiment of the present invention.
Figure 5B:
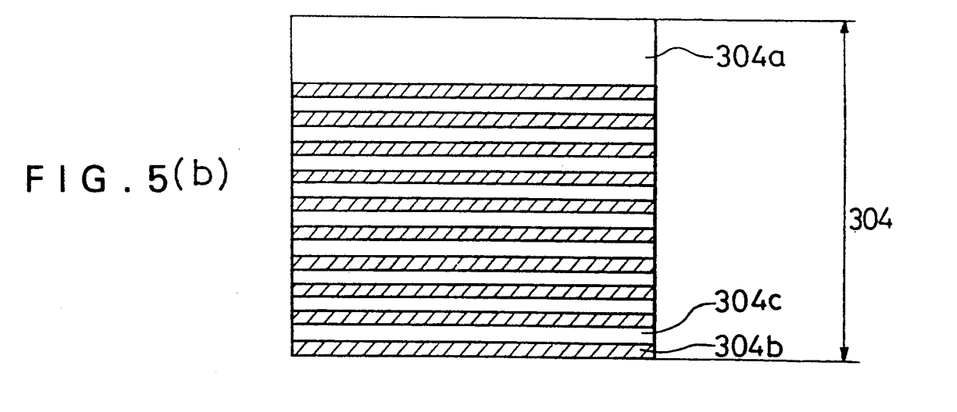

FIG. 5(a) is a cross-sectional view showing a semiconductor laser device incorporating an MQB in accordance with a fourth embodiment of the present invention. FIG. 5(b) is a cross-sectional view showing the structure of the MQB in detail. In the figures, a strained MQB 304 is inserted between an active layer 103 and an n type cladding layer 102. The MQB 304 comprises twenty layers, i.e., a $(Al_{0.7}Ga_{0.3})_{0.5}In_{0.5}P$ barrier layer 304a 226 angstroms thick, ten $Ga_zIn_{1-z}P$ well layers 304b each 17 angstroms thick, and nine $(Al_{0.7}Ga_{0.3})_{0.5}In_{0.5}P$ barrier layers 304c each 11.5 angstroms thick. In addition, the same reference numerals as those in FIG. 1 designate the same parts.

Figure 6:
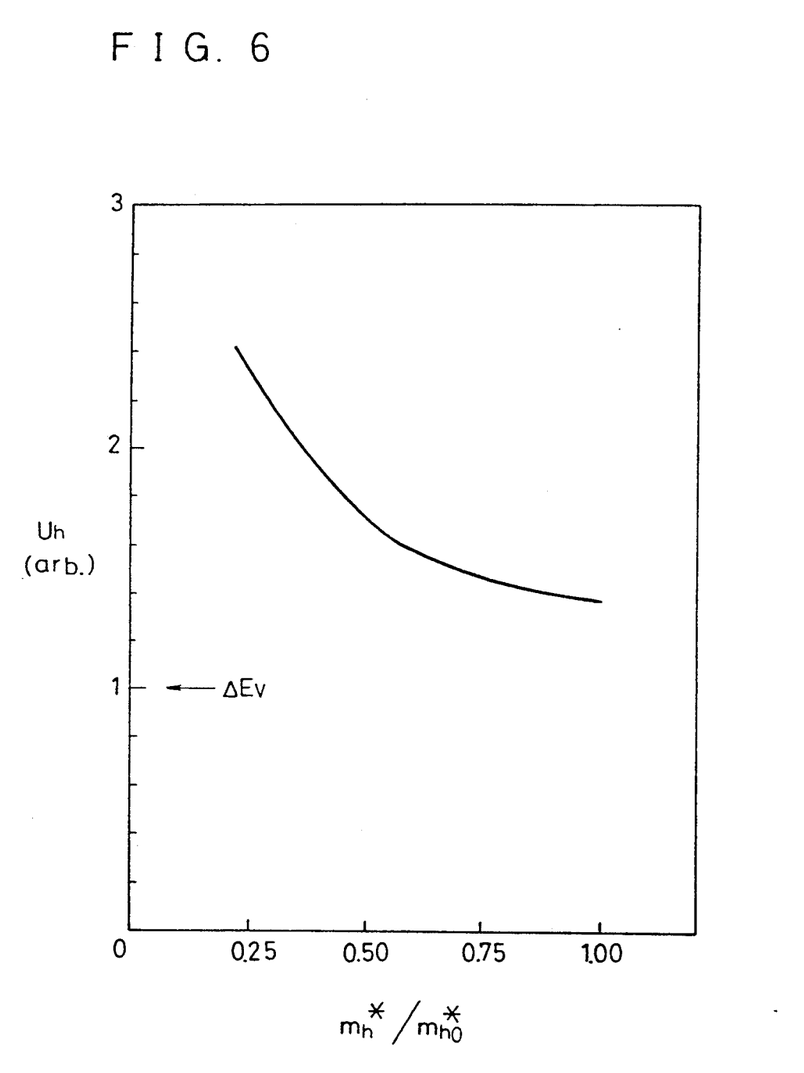
FIG. 6 is a graph showing a relation between height of a potential barrier for confining holes and the effective mass of the holes.

In the MQB structure of this embodiment, when z is smaller than 0.5 in the $Ga_zIn_{1-z}P$ well layer 304b, a compressive strain is applied to the well layer and the effective mass of holes in the well layer decreases. FIG. 6 is a graph showing how the height of the barrier for confining holes varies with the decrease in the effective mass of holes. In FIG. 6, reference character Ev designates the size of a discontinuity in the valence band at a heterojunction between the $Ga_xIn_{1-x}P$ active layer and the $(Al_{0.7}Ga_{0.3})_{0.5}In_{0.5}P$ cladding layer. Reference character Uh designates the height of the effective barrier for confining holes. Reference character m*ho designates the effective mass of holes in the $Ga_zIn_{1-z}P$ well layer 304b which lattice-matches with GaAs when z is equal to 0.5. Reference character m*h designates the effective mass of holes in the $Ga_zIn_{1-z}P$ well layer 304b when z is smaller than 0.5. In addition, the abscissa shows the ratio of m*h to m*ho and the ordinate shows Uh relative to ΔEv.

As shown in FIG. 6, when z is equal to 0.5 in the $Ga_zIn_{1-z}P$, i.e., when m*ho is equal to m*h (m*h/m*ho=1), Uh is about 1.4. In other words, when no strain is applied to the $Ga_zIn_{1-z}P$ well layer 304b, the height of the barrier for confining holes increases by only 40 percent. However, when a compressive strain is applied to the $Ga_zIn_{1-z}P$ well layer 304b, i.e., when z is smaller than 0.5, Uh increases with the decrease in the effective mass of holes. For example, when m*h/m*ho is equal to 0.25, i.e., when the effective mass of holes is reduced by applying the compressive strain to one fourth of the effective mass of holes when no strain is applied, Uh is approximately equal to 2.4, which means that the height of the barrier for confining holes significantly increases.

In this way, the strained MQB of this embodiment is effective in increasing the height of the barrier for confining holes.

In the semiconductor laser device according to this embodiment, the strained MQB 304 is inserted between the active layer 103 and the n type cladding layer 102 and the MQB 104, to which no strain is applied, is inserted between the active layer 103 and the p type cladding layer 105. In this structure, electrons and holes are effectively confined in the active layer by the MQBs 104 and 304 and never overflow into the cladding layers, resulting in a semiconductor laser which oscillates with very low threshold current. In addition, the temperature characteristic of the laser is improved, resulting in a semiconductor laser which operates at a high temperature.

In the fourth embodiment of the present invention, even when the active layer includes no layer to which a strain is applied, since the strained MQB significantly increases the height of the barrier for confining holes, the same effect as described above is obtained.

In addition, since the strained MQB also increases the height of the barrier for confining electrons, the strained MQB may be inserted between the p type cladding layer and the active layer.

Figure 7A:
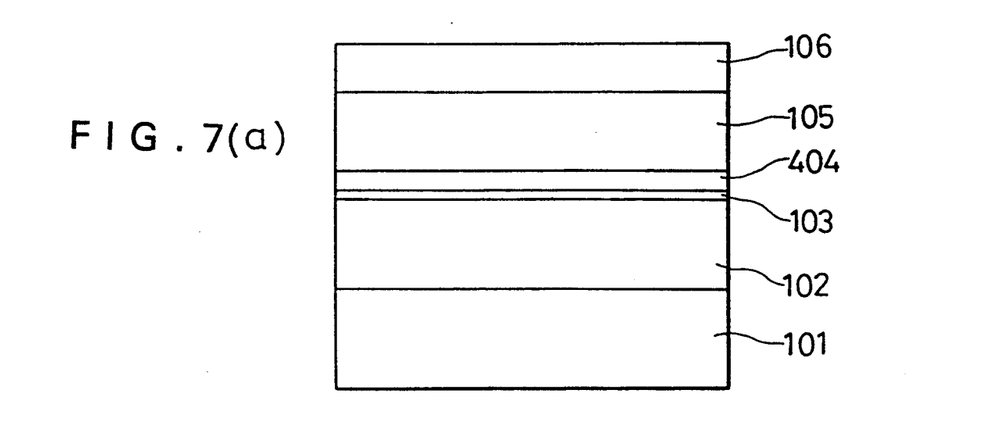
FIGS. 7(a)-7(b) are cross-sectional views showing a semiconductor laser device in accordance with a fifth embodiment of the present invention.
Figure 7B:
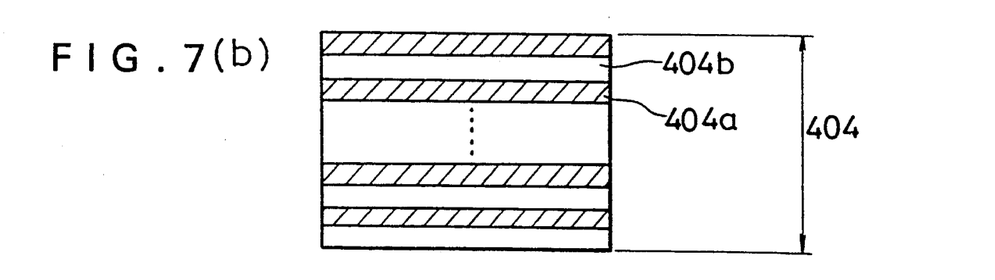

FIG. 7(a) is a cross-sectional view showing a semiconductor laser device incorporating an MQB in accordance with a fifth embodiment of the present invention and FIG. 7(b) is a cross-sectional view showing the MQB in detail.

In this fifth embodiment, a description is given of an MQB which is effective in improving characteristics of an AlGaInP laser device producing visible light.

In FIG. 7(b), an MQB 404 has a superlattice multilayer structure comprising a plurality of AlGaInP barrier layers 404a and a plurality of AlGaAs well layers 404b. The energy band gap of the barrier layer 404a must always be higher than that of the well layer 404b. For example, when the barrier layer 404a comprises $(Al_{0.7}Ga_{0.3})_{0.5}In_{0.5}P$ and the well layer 404b comprises GaAs, the (difference in energy band gaps between these layers is about 1.6 eV. This is 1.2 eV larger than the difference in energy band gaps of 0.4 eV between the $Ga_{0.5}In_{0.5}P$ well layer and the $(Al_{0.7}Ga_{0.3})_{0.5}In_{0.5}P$ barrier layer shown in FIG. 1(b). Therefore, the height of the barrier for confining carriers is further increased.

Furthermore, in this embodiment well layer 304b can be highly doped. Generally, it is difficult to incorporate dopant impurities into AlGaInP in a high concentration. Accordingly, the MQB comprising only AlGaInP system materials has a relatively high resistance, increasing the series resistance of the laser. As the result the consumption of power by the laser increases. In the MQB structure of this embodiment, since the well layer comprises AlGaAs system material to which dopant impurities can be added in a high concentration, the resistance of the MQB itself is reduced and the series resistance of the laser is reduced. Thus, the height of the effective barrier caused by the MQB is further increased while the series resistance caused by th MQB is reduced, resulting in a semiconductor laser device producing visible light which consumes less power.

According to the fifth embodiment of the present invention, a semiconductor laser device that confines carriers with high efficiency and reduces the consumption power is realized.

While in the fifth embodiment no strain is applied to the MQB 404, strain may be applied to the MQB by adjusting the composition of the barrier layer, whereby the carrier confining effect is further increased.

What is claimed is:

1. A semiconductor laser device including:
   a first conductivity type cladding layer, an active layer, and a second conductivity type cladding layer successively disposed on a first conductivity type substrate having a lattice constant; and
   a first multiquantum barrier superlattice structure disposed between said active layer and one of said cladding layers wherein said active layer includes a crystalline composition having a lattice constant different from the lattice constant of said first conductivity type substrate by at least 0.1 percent so that strain is applied to said active layer.

2. The semiconductor laser device of claim 1 wherein said active layer comprises a plurality of semiconductor layers including at least one layer to which strain is applied.

3. The semiconductor laser device of claim 1 including a second multiquantum barrier superlattice structure wherein the first of said multiquantum barrier structure is disposed between said first conductivity type cladding layer and said active layer and the second of said multiquantum barrier structures is disposed said second conductivity type cladding layer and said active layer.

4. The semiconductor laser device of claim 1 wherein said first multiquantum barrier structure includes semiconductor layers having alternating relatively large and relatively small energy band gaps and at least one of said semiconductor layers has a lattice constant different from the lattice constant of said first conductivity type substrate by at least 0.1 percent so that strain is applied to said at least one semiconductor layer.

5. The semiconductor laser device of claim 4 wherein said first multiquantum barrier structure is disposed between an n type cladding layer and said active layer.

6. The semiconductor laser device of claim 1 wherein said multiquantum barrier structure comprises a semiconductor material that can incorporate a high concentration of a dopant impurity.

7. A semiconductor laser device including:
   a first conductivity type cladding layer, an active layer, and a second conductivity type cladding layer successively disposed on a first conductivity type substrate having a lattice constant; and
   a multiquantum barrier structure disposed between said active layer and one of said cladding layers, said multiquantum barrier structure comprising alternating semiconductor layers having relatively large and relatively small energy band gaps wherein at least one of said semiconductor layers has a lattice constant different from the lattice constant of the first conductivity type substrate by at least 0.1 percent so that strain is applied to said at least one semiconductor layer.

8. The semiconductor laser device of claim 7 wherein said multiquantum barrier structure is disposed between an n type cladding layer and said active layer.

9. The semiconductor laser device of claim 7 wherein said multiquantum barrier structure comprises a semiconductor material that can incorporate a high concentration of a dopant impurity.

10. The semiconductor laser device of claim 9 wherein said first conductivity type substrate comprises GaAs, said first conductivity type cladding layer, said active layer, and said second conductivity type cladding layer comprise AlGaInP, and said multiquantum barrier structure comprises AlGaInP and AlGaAs.

* * * * *